US 8,507,307 B2

(12) United States Patent
Kimball et al.

(10) Patent No.: US 8,507,307 B2
(45) Date of Patent: Aug. 13, 2013

(54) GROUP IIB/VA SEMICONDUCTORS SUITABLE FOR USE IN PHOTOVOLTAIC DEVICES

(75) Inventors: Gregory M. Kimball, Pasadena, CA (US); Marty W. DeGroot, Midland, MI (US); Nathan S. Lewis, La Canada, CA (US); Harry A. Atwater, South Pasadena, CA (US)

(73) Assignees: Dow Global Technologies LLC, Midland, MI (US); California Institute of Technology, Pasadena, CA (US)

( * ) Notice: Subject to any disclaimer, the term of this patent is extended or adjusted under 35 U.S.C. 154(b) by 152 days.

(21) Appl. No.: 13/160,681

(22) Filed: Jun. 15, 2011

(65) Prior Publication Data
US 2011/0309477 A1    Dec. 22, 2011

Related U.S. Application Data

(60) Provisional application No. 61/355,344, filed on Jun. 16, 2010.

(51) Int. Cl.
*H01L 31/109* (2006.01)

(52) U.S. Cl.
USPC ........ 438/57; 438/63; 257/189; 257/E21.482; 257/E25.009

(58) Field of Classification Search
USPC ....... 438/46, 48, 57, 63, 84, 86, 120; 257/10, 257/11, 53, 183, 184, 189, E21.482, E25.009
See application file for complete search history.

(56) References Cited

U.S. PATENT DOCUMENTS

| 4,325,986 | A | 4/1982 | Baron et al. |
|---|---|---|---|
| 4,342,879 | A | 8/1982 | Catalano et al. |
| 4,443,653 | A | 4/1984 | Catalano et al. |
| 4,477,688 | A | 10/1984 | Barnett et al. |
| 6,913,943 | B2 * | 7/2005 | Cunningham et al. .......... 438/57 |
| 7,303,632 | B2 | 12/2007 | Negley |
| 2006/0112985 | A1 | 6/2006 | Hantschel et al. |

FOREIGN PATENT DOCUMENTS

| EP | 0 009 401 A1 | 4/1980 |
|---|---|---|
| JP | 04-072774 | 3/1992 |

OTHER PUBLICATIONS

E.A Fagan, "Optical properties of $Zn_3P_2$," J. Appl. Phys., vol. 50, No. 10, Oct. 1979, pp. 6505-6515.
N. Convers Wyeth et al., "Spectral response measurements of minority-carrier diffusion length in $Zn_3P_2$," J. Appl. Phys., vol. 50, No. 3, Mar. 1979, pp. 1403-1407.

(Continued)

Primary Examiner — Hoai V Pham
(74) Attorney, Agent, or Firm — Kagan Binder, PLLC

(57) ABSTRACT

The present invention relates to devices, particularly photovoltaic devices, incorporating Group IIB/VA semiconductors such phosphides, arsenides, and/or antimonides of one or more of Zn and/or Cd. In particular, the present invention relates to methodologies, resultant products, and precursors thereof in which electronic performance of the semiconductor material is improved by causing the Group IIB/VA semiconductor material to react with at least one metal-containing species (hereinafter co-reactive species) that is sufficiently co-reactive with at least one Group VA species incorporated into the Group IIB/VA semiconductor as a lattice substituent (recognizing that the same and/or another Group VA species also optionally may be incorporated into the Group IIB/VA semiconductor in other ways, e.g., as a dopant or the like).

23 Claims, 5 Drawing Sheets

(56) References Cited

OTHER PUBLICATIONS

A. Catalano et al., "Defect Dominated Conductivity in $Zn_3P_2$" J. Phys. Chem. Solids, vol. 41, 1980, pp. 635-640.

Faa-Ching Wang et al., "Transport mechanisms for $Mg/Zn_3P_2$ junctions" J. Appl. Phys., vol. 53, No. 12, Dec. 1982, pp. 8874-8879.

M. Bhushan et al.., "Photoelectrochemical Investigation of $Zn_3P_2$" J. Electrochem. Soc.: Electrochemical Science and Technology 133(3), Mar. 1986, pp. 536-539.

M. Bushan et al., "Polycrystalline $Zn_3P_2$ Schottky barrier solar cells" Appl. Phys. Lett., vol. 38, No. 1, Jan. 1, 1981, pp. 39-41.

Suda et al., "N-Type zinc phosphide grown by molecular beam epitaxy" Appl. Phys. Lett., vol. 69, No. 16, Oct. 14, 1996, pp. 2426-2428.

Schlesinger, "The Thermodynamic Properties of Phosphorus and Solid Binary Phosphides" Chem Rev., 102, 2002, pp. 4267-4301.

F.G. Johnson et al., "Phosphorus cracking efficiency and flux transients from a valved effusion cell" J. Appl. Phys. vol. 78, No. 3, Aug. 1, 1995, pp. 1664-1668.

Faa-Ching Wang et al., "Spectral response of ac photoconductivity in $Zn_3P_2$" J. Appl. Phys., vol. 53, No. 4, Apr. 1982, pp. 3335-3338.

Chernogorenko et al., "Part II Compilation and Presentation of Thermochemical Data" and "Part III Tables in the Present Work" Thermochemical Data of Pure Substances, Third Edition, vol. I Ag-Kr, pp. I-34-I-36, 1995.

V.B. Chernogorenko et al., "Thermodynamic Analysis of the Combustion of Metal Powders and Their Oxides in Phosphorus and of the Combustion of the Phosphides Formed in Oxygen" Combustion, Explosion, and Shock Waves, col. 34, No. 3, 1998, pp. 298-304.

L.L. Kazmerski et al., "Surface and interface properties of $Zn_3P_2$ solar cells" J. Vac. Sci. Technol., vol. 18, No. 2, Mar. 1981, pp. 368-371.

M. Bhushan, "Mg diffused zinc phosphide n/p junctions" J. Appl. Phys., vol. 53, No. 1, Jan. 1992, pp. 514-519.

I P McClean et al., "Photoluminescence study of MBE-grown films of ZnS" Semicond. Sci. Technol., 7, 1992, pp. 1394-1399.

Kimball et al., "Photoluminescence-based measurement of the energy gap and diffusion length of $Zn_3P_2$" Appl. Phys. Lett., vol. 95, 2009, pp. 112103-1-112103-3.

\* cited by examiner

GROUP IIB/VA SEMICONDUCTORS SUITABLE FOR USE IN PHOTOVOLTAIC DEVICES

PRIORITY

The present nonprovisional patent Application claims priority under 35 U.S.C. §119(e) from U.S. Provisional patent application having Ser. No. 61/355,344, filed on Jun. 16, 2010, by Kimball et al. and titled IMPROVED GROUP IIB/VA SEMICONDUCTORS SUITABLE FOR USE IN PHOTOVOLTAIC DEVICES, wherein the entirety of said provisional patent application is incorporated herein by reference.

FIELD OF THE INVENTION

The present invention relates to photovoltaic devices incorporating Group IIB/VA semiconductors such as phosphides, arsenides, and/or antimonides of one or more of Zn and/or Cd. In particular, the present invention relates to methodologies, resultant products, and precursors thereof in which electronic performance of the semiconductor material is improved by heating the semiconductor material while in contact with at least one material (e.g. Mg, Ca, Sr, Ba, Sc, Y, Ti, Zr, V, Cr, Nb, Mo, Hf and/or the like) that is co-reactive with a Group VA element.

BACKGROUND OF THE INVENTION

Zinc phosphide ($Zn_3P_2$) and similar Group IIB/VA semiconductor materials have significant potential as absorbers in thin film photovoltaic devices. Zinc phosphide, for example, has a reported direct band gap of 1.5 eV, high light absorbance in the visible region (e.g., greater than $10^4$ to $10^5$ $cm^1$), and long minority carrier diffusion lengths (about 5 to about 10 μm). This would permit high current collection efficiency. Also, materials such as Zn and P are abundant and low cost.

Zinc phosphide is known to be either p-type or n-type. To date, it has been much easier to fabricate p-type zinc phosphide. Preparing n-type zinc phosphide, particularly using methodologies suitable for the industrial scale, remains challenging. This has confounded the fabrication of p-n homojunctions based upon zinc phosphide. Consequently, solar cells using zinc phosphide most commonly are constructed with Mg Schottky contacts or p/n heterojunctions. Exemplary photovoltaic devices include those incorporating Schottky contacts based upon p-$Zn_3P_2$/Mg and have exhibited greater than about 6% efficiency for solar energy conversion. The efficiency of such diodes theoretically limits open circuit voltage to about 0.5 volts due to the about 0.8 eV bather height observed for metals such as Mg.

Improved efficiency and open circuit voltage would be expected, though, from p/n homojunction cells for which the junction is formed by contiguous regions of the same semiconductor material having p and n type conductivity, respectively. One exemplary advantage of a p/n homojunction would be a minimization of discontinuity in the energy band structure while the gross composition remains the same. Also, indices of refraction of the adjacent p/n material would match, minimizing reflection losses. Also, the coefficients of thermal expansion would be matched to minimize potential delamination risks.

Some investigators have suggested that a p/n homojunction can form in situ when a layer of p-type zinc phosphide is heated while in contact with magnesium. See, e.g., U.S. Pat. No. 4,342,879. Other investigators have prepared n-type zinc phosphide using molecular beam epitaxy. Other approaches to make n-type zinc phosphide also have been attempted. However, such approaches generally yield devices with poor photovoltaic behavior, if any, due at least in part to poor film quality, lack of control over film stoichiometry, and/or lack of control over formation of high quality p/n junctions.

Strategies for improving the quality and electronic performance of microelectronic devices incorporating Group IIB/VA semiconductors are strongly desired.

SUMMARY OF THE INVENTION

The present invention relates to devices, particularly photovoltaic devices, incorporating Group IIB/VA semiconductors such as phosphides, arsenides, and/or antimonides (also collectively referred to in the art as pnictides) of one or more of Zn and/or Cd. In particular, the present invention relates to methodologies, resultant products, and precursors thereof in which electronic performance of the semiconductor material is improved by causing the Group IIB/VA semiconductor material to react with at least one metal-containing species (hereinafter co-reactive species) that is sufficiently co-reactive with at least one Group VA species incorporated into the Group IIB/VA semiconductor as a lattice substituent (recognizing that the same and/or another Group VA species also optionally may be incorporated into the Group IIB/VA semiconductor in other ways, e.g., as a dopant or the like).

In some embodiments, the reaction may occur by heating the semiconductor material while in contact with the co-reactive species, although heating may not be required when the co-reactive species is sufficiently reactive. In representative embodiments, it is believed that the reaction may form p/n homojunction, heterojunction, and/or passivating features with improved resolution and quality.

The present invention is based at least in part upon the appreciation that a co-reactive species with a sufficient threshold of reactivity for the lattice Group VA species can yield devices with dramatically improved electronic performance upon reacting with the Group IIB/VA semiconductor. In preferred embodiments, a heat treatment is performed on a precursor of a device, particularly a photovoltaic device, to accomplish the reaction.

When using combinations of co-reactive species and Group IIB/VA semiconductors with reactivity characteristics as described herein, it is believed that the co-reactive species reacts with one or more constituents of the Group IIB/VA semiconductor material. Without wishing to be bound by theory, it is believed that the reaction converts a relatively well-defined region of a p-type Group IIB/VA semiconductor to an n-type Group IIB/VA semiconductor in situ to thereby form a p/n homojunction and/or heterojunction between the p-type and n-type regions with improved resolution. In practical effect, the reaction between the co-reactive species and the Group VA species may cause the relative Group VA content of the corresponding p-type region to be depleted while the relative Group IIB content is increased via intrinsic doping. By way of example, Ca reacts with phosphorous to form calcium phosphide. This depletes the phosphorous content in the portion of the p-type material in which the reaction occurred. The portion thus becomes relatively Zn-rich via intrinsic doping, thereby being converted from p-type to n-type. Alternatively, the reaction may result in an n-type, mixed metal phosphide to form a heterojunction between the p-type and n-type materials. For example, Ca could react with p-type zinc phosphide to form an n-type calcium zinc phosphide.

The reaction also is believed to provide a passivation effect in which the interface between the Group IIB/VA semiconductor material and overlying layers is improved. Without wishing to be bound, it is believed that the reaction between Group VA material of the semiconductor and the co-reactive species helps to provide a transition region in situ whose formation helps to remove defects and native oxide to provide the passivation. As one example, the reaction between Ca and zinc phosphide could yield a passivating region including calcium phosphide proximal to the original interface between the zinc phosphide and the calcium in the article being treated.

In one aspect, the present invention relates to a method of making a photovoltaic device or portion thereof, comprising the steps of:

(a) providing at least one p-type Group IIB/VA semiconductor in a semiconductor region; and (b) causing the at least one p-type Group IIB/VA semiconductor region to react with a species that is co-reactive with a Group VA element incorporated into the semiconductor region and that is in contact with the semiconductor region with the proviso that, if the at least one metal-containing species includes Mg, then at least one of (i) the Mg is present in combination with at least one other metal-containing species co-reactive with a Group VA element that has a phosphide enthalpy of formation at standard temperature and pressure that is more negative than the phosphide enthalpy of formation at standard temperature and pressure of magnesium phosphide; and/or (ii) if the Group IIB/VA semiconductor includes zinc phosphide, then the semiconductor region comprises at least one additional Group IIB/VA semiconductor; and/or (iii) (iii) at least one pnictide reaction product has a pnictide enthalpy of formation at standard temperature and pressure that is at least 100 kJ/mol-Pn more negative than the enthalpy of formation at standard temperature and pressure of at least one p-type Group IIB/VA semiconductor included in the semiconductor region.

In another aspect, the present invention relates to a method of making a p/n photovoltaic junction comprising a Group IIB/VA semiconductor comprising the steps of:

(a) providing at least one p-type Group IIB/VA semiconductor;

(b) providing at least one metal-containing species in contact with the semiconductor, wherein the metal-containing species has a Net Reactivity that is −100 kJ/mol-Pn or more negative with respect to the Group IIB/VA semiconductor; and (c) a portion of the at least one p-type Group IIB/VA semiconductor to an n-type semiconductor.

In another aspect, the present invention relates to a photovoltaic device comprising:

(a) at least one p-type Group IIB/VA semiconductor region and (b) at least one n-type semiconductor region in contact with the p-type Group IIB/VA semiconductor region, wherein (i) the n-type semiconductor region comprises or is in contact with at least one metal pnictide for which a metal constituent of the metal pnictide has a Net Reactivity with respect to the p-type Group IIB/VA semiconductor region that is about −100 kJ/mol-Pn or more negative with respect to the p-type Group IIB/VA semiconductor, or (ii) a p/n junction is at an interface between the p-type and n-type regions; and the device further comprises additional region in contact with at least one of the p-type and n-type regions that includes at least one reaction product between a Group VA element of the p-type Group IIB/VA semiconductor region and at least one metal species other than Mg that is co-reactive with the Group VA element of the p-type Group IIB/VA semiconductor region.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. All patents, pending patent applications, published patent applications, and technical articles cited herein are incorporated herein by reference in their respective entireties for all purposes.

Figure 1:
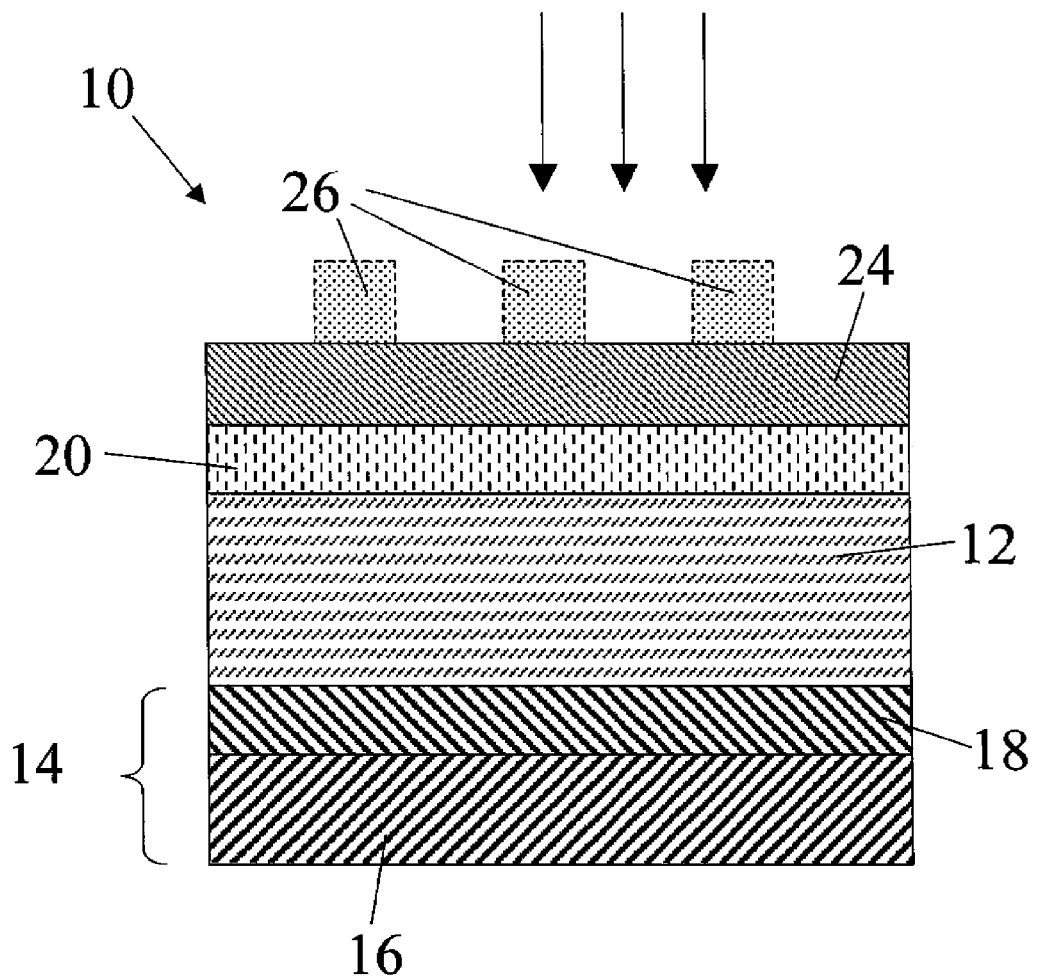
FIG. 1 is a schematic illustration in cross-section of a device precursor that incorporates a semiconductor region comprising a p-type Group IIB/VA semiconductor and a region in contact with the semiconductor region that includes at least one species that is sufficiently co-reactive with a Group VA element in the semiconductor region in accordance with principles of the present invention.
Figure 2:
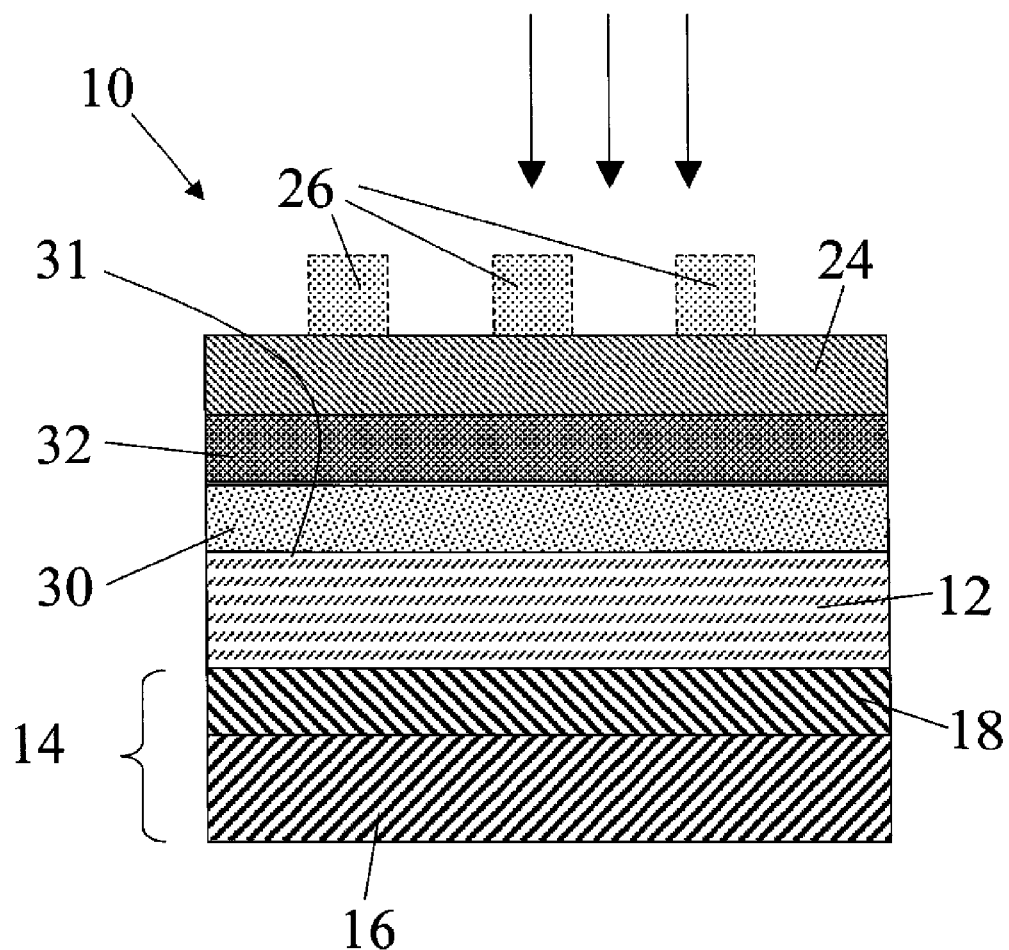
FIG. 2 is a schematic illustration in cross-section shown a device including a p/n Group IIB/VA homojunction that is believed to result upon heat treating the precursor of FIG. 1.

FIGS. 1 and 2 schematically show one illustrative mode of practice in which the principles of the present invention are used to improve the electronic performance of precursor 10 of FIG. 1 into the improved, working photovoltaic cell 100 of FIG. 2. Referring first to FIG. 1, precursor 10 includes p-type semiconductor region 12 that includes (a) at least one Group IIB element and (b) at least one Group VA element. Such semiconductors are referred to herein as Group IIB/VA semiconductors. Examples of IIB elements include Zn and/or Cd. Zn is presently preferred. Examples of Group VA elements (also referred to as pnictogens) include phosphorous, arsenic, antimony, and combinations of these. Phosphorous is presently preferred.

Exemplary embodiments of Group IIB/VA semiconductors include pnictides such as zinc phosphide ($Zn_3P_2$), zinc arsenide ($Zn_3As_2$), zinc antimonide ($Zn_3Sb_2$), cadmium phosphide ($Cd_3P_2$), cadmium arsenide ($Cd_3As_2$), cadmium antimonide ($Cd_3Sb_2$), combinations of these, and the like. Pnictides including a combination of Group JIB species and/or a combination of Group VA species (e.g., $Cd_xZn_yP_2$, wherein each x and y is independently about 0.001 to about 2.999 and x+y is 3) also may be used. In an illustrative embodiment, the Group IIB/VA semiconductor material comprises p-type $Zn_3P_2$. Optionally, other kinds of semiconductor materials also may be incorporated into region 12.

Generally, the semiconductor region 12 has a thickness effective to capture incident light for photovoltaic performance. If the region 12 were to be too thin, too much light may pass through the region 12 without being absorbed. Layers that are too thick will provide photovoltaic functionality, but are wasteful in the sense of using more material than is needed for effective light capture and reduced fill factors due to increased series resistance. Balancing such concerns, an illustrative thickness of semiconductor region 12 is in the range from about 0.5 to about 20 µm, preferably 2 to about 5 µm.

Semiconductor region 12 is supported upon substrate 14. Substrate 14 may be rigid or flexible, but desirably is flexible in those embodiments in which the resultant photovoltaic device 100 may be used in combination with non-flat surfaces. Substrate 14 may have a single or multilayer construction wherein at least one electrically conductive layer is in ohmic contact with the semiconductor region 12. For purposes of illustration, substrate 14 is shown as including an optional support 16 and backside electrical contact region 18.

Support 16 may be formed from a wide range of materials. These include glass, quartz, other ceramic materials, polymers, metals, metal alloys, intermetallic compositions, woven or non-woven fabrics, natural or synthetic cellulosic materials, combinations of these, and the like. For many applications involving thin film photovoltaic devices, a conductive support such as stainless steel is preferred to enable facile contact to the back of the device. For monolithically integrated photovoltaic devices a non-conductive substrate such as polyimide is preferred. The support 16 desirably is cleaned prior to use to remove contaminants, such as organic contaminants. A wide variety of cleaning techniques may be used. As one example, plasma cleaning, such as by using RF plasma, would be suitable to remove organic contaminants from metal-containing supports. Other examples of useful cleaning techniques include ion etching, wet chemical bathing, and the like.

The backside electrical contact region 18 provides a convenient way to electrically couple the resultant device 100 to external circuitry (not shown). The backside electrical contact region 18 also helps to isolate the semiconductor region 12 from the support 16 to minimize cross-contamination. As is the case with any of the regions of device 10, region 18 may be formed from a single layer or multiple layer using a wide range of electrically conductive materials, including one or more of Cu, Mo, Ag, Au, Al, Cr, Ni, Ti, Ta, Nb, W combinations of these, and the like. Conductive compositions incorporating Ag may be used in an illustrative embodiment.

Generally, the backside electrical contact region 18 has a thickness effective to provide good quality ohmic contact with the semiconductor region 12 within the desired operating parameters (e.g., voltage and current specifications) of the resultant device 100. An illustrative thickness of backside electrical contact region 18 is in the range from about 0.01 to about 1 µm, preferably 0.05 to about 0.2 µm.

The backside electrical contact region 18 can be deposited on the Group IIB/VA semiconductor material after which support 16 is formed, laminated, or otherwise applied to region 18. Alternatively, the Group IIB/VA semiconductor can be deposited onto a substrate comprising a backside electrical contact region 18 and an optional support 16.

Precursor 10 includes region 20 formed on semiconductor region 12. Region 20 includes at least one species (hereinafter co-reactive species) that is sufficiently reactive with at least one lattice Group VA species (such as P, As, and/or Sb, referred to herein as pnictogens or pnictogen atoms; additionally, the symbol Pn is used herein as the symbol for a pnictogen atom generally) included in a Group IIB/VA semiconductor of region 12 to form a phosphide, arsenide, and/or antimonide such that the enthalpy of formation of the resulting pnictide (hereinafter also referred to as pnictide product) is at least about 100 kJ/mol-Pn (kilo joules per mol pnictogen atom), preferably at least 170 kJ/mol-Pn, more preferably at least 200 to 500 kJ/mol-Pn, and even at least 300 to 500 kJ/mol-Pn more negative than the enthalpy of formation of the Group IIB/VA semiconductor that serves as a source of the Group VA species. Note that all enthalpy of formations provided herein are in units of kJ/mol-Pn and are determined at standard temperature and pressure unless otherwise expressly stated. In the literature, such an enthalpy of formation is also referred to as the standard enthalpy of formation, but some reported values may be in units of kJ/mol rather than being normalized per mole of pnictogen atom when expressed as kJ/mol-Pn.

The standard enthalpy of formation of a compound is the change of enthalpy that accompanies the formation of 1 mole of the compound in its standard state from its constituent elements in their standard states. For example, the standard enthalpy of formation for a metal phosphide is the energy released in kJ when 1 mol of metal phosphide is formed by the reaction of the appropriate amounts of elemental metal and elemental phosphorus. This can be normalized by expressing the value per mole of pnictogen atom. Thus, the enthalpy of formation of zinc phosphide, which includes two P atoms per molecule, can be divided by two to normalize per mole of pnictogen atom. The enthalpy of formation for titanium phosphide, which includes one P atom per molecule, is divided by one to normalize.

For purposes of the present invention, the enthalpy of formation for a pnictide material is based on the formation of the pnictide from its constituent elements, regardless of the manner in which the pnictide at issue is actually sourced. Thus, the heat of formation for calcium phosphide is −271 kj/mol-Pn for purposes of the present invention and for purposes of determining Net Reactivity (defined below) regardless of the manner in which the calcium is sourced, e.g., from Ca metal in its standard state or an alloy, compound, or other composition including calcium.

Calorimetry techniques are traditionally used to measure enthalpy of formation. Enthalpies of formation are widely reported in the literature and these values can be used to calculate the heat of reaction as described above. Two literature values are deemed to be comparable if the difference between the two values is 5% or less of the average of the two values. In case of a conflict between values reported in the literature, the value recited in the most current NIST/ThermoData Engine 10/3a—Pure Compounds shall control. If not reported in this NIST database, then the values reported in NIST/ThermoData Engine 103b—Pure Compounds, Binary Mixtures, and Chemical Reactions shall control. If the value is not included in either NIST database, then the value determined according to the method described in ASTM 2160-04 (Standard Test Method for Heat of Reaction of Thermally Reactive Materials by Differential Scanning Calorimetry) shall control.

The present invention appreciates that the difference between the heats of formation of such a pnictide product and a p-type Group IIB/VA semiconductor is an important factor when reacting a Group IIB/VA semiconductor material with a co-reactive species. Note that this reaction may yield a pnictide product that also has semiconductor properties. This difference hereinafter is also referred to as the Net Reactivity of the co-reactive species with respect to the Group IIB/VA semiconductor. According to the present invention, the Net Reactivity is strongly negative, i.e., at least negative 100 kJ/mol-Pn or more negative in accordance with the present invention to provide improved electronic performance that is believed to be attributable to the formation of p/n homojunction, p/n heterojunction, and/or passivating features upon reaction.

The desired strongly negative Net Reactivity is defined below. In practical effect, a strongly negative Net Reactivity indicates that the reaction of the co-reactive species of region 20 with the Group VA species of region 12 (see FIG. 1) is at least 100 kJ/mol more thermodynamically favorable than is a reaction between that Group VA species and the Group IIB species of region 12. As the Net Reactivity becomes more negative, the thermodynamic energy favoring reaction to form the desired pnictide product, and hence the desired formation of p/n homojunction and/or passivation features, increases.

The present invention thus exploits a thermodynamic advantage to promote desired reactions, such as formation of a desired passivation region and/or to promote formation of an n-type material. For a homojunction, this may occur via depletion of lattice Group VA species and corresponding relative enrichment of the Group IIB species. For a heterojunction, this may occur via formation of an n-type mixed metal phosphide, e.g., calcium zinc phosphide. Consequently, the use of co-reactive species having the kind of strongly negative Net Reactivity as preferred herein allows the desired reaction(s) to provide resultant devices with substantially improved quality and electronic performance.

One reason to use a strongly reactive metal is to reduce the degree of heat, if any, needed for the reaction to proceed. It is strongly suspected that even moderate annealing conditions would introduce low level amounts of migrating contaminants, perhaps on the order of about $10^{14}$ to $10^{18}$ cm$^{-3}$, into the Group IIB/VA semiconductor to deleterious effect. A more reactive co-reactive species would require less heat treatment at lower temperatures, or perhaps no heat treatment at all, thereby mitigating the unwanted diffusion of contaminants into the Group IIB/VA semiconductor. Furthermore, the ability to process the semiconductor device at lower temperatures is advantageous not only to reduce the risk of detrimental migration from other device layers (e.g., such as from the transparent conductive oxide and/or substrate), but it also provides a lower cost process and reduces the risk of other kinds of thermal degradation that could occur to the device at higher temperature.

On the other hand, if the Net Reactivity is too low, then the desired reactions may not occur, or may not occur as effectively. This would impair the quality of homojunction and/or passivation features that are believed to form upon heat treatment (described further below in FIG. 2).

To evaluate if a candidate co-reactive species would exhibit a sufficiently negative Net Reactivity with respect to a Group IIB/VA semiconductor, the Net Reactivity of the co-reactive species with respect to the Group IIB/VA semiconductor may be determined by the expression $$N_R = \Delta H^\circ_{f,M} - \Delta H^\circ_{f,S},$$

wherein $N_R$ is the Net Reactivity in kJ/mol-Pn, $\Delta H^\circ_{f,M}$ is the enthalpy of formation at standard temperature and pressure of the corresponding metal pnictide product from its constituent elements in kJ/mol-Pn, and $\Delta H^\circ_{f,S}$ is the enthalpy of formation at standard temperature and pressure of the Group IIB/VA semiconductor from its constituent elements in kJ/mol-Pn.

Depending upon the Group IIB/VA semiconductor(s) of region 12, a wide range of co-reactive species may be incorporated into region 20. Examples of co-reactive species include one or more of Mg, Ca, Sr, Ba, Sc, Y, Ti, Zr, V, Cr, Nb, Mo, Hf, compounds of these, alloys of these, combinations of these, and the like. So long as region 20 includes at least one of such species that has the desired strongly negative Net Reactivity relative to the Group IIB/VA semiconductor of region 12, region 20 optionally may include other co-reactive species that are similarly reactive, less reactive, and/or more reactive with the Group VA species.

If more than one co-reactive species and/or more than one Group IIB/VA semiconductor is being used, the Net Reactivity for each corresponding combination of a particular co-reactive species and Group IIB/VA semiconductor may be determined individually to see if at least one such combination on its own provides a Net Reactivity that is about –100 kJ/mol-Pn or more negative. So long as at least one such pair together constituting at least 5 weight percent, preferably at least 10 weight percent, and more preferably at least about 25 weight percent of the total amount of metal containing species and Group IIB/VA semiconductor present has a Net Reactivity that is –100 kJ/mol-Pn or more negative, the criteria shall be deemed to be satisfied for purposes of the present invention.

Although combinations of co-reactive species may be used in region 20, in particularly preferred embodiments, region 20 includes less than 10 weight percent, and even more preferably from about 0 to about 1 weight percent of other species having a Net Reactivity that is more positive than about –100 kJ/mol-Pn as determined with respect to the Group IIB/VA semiconductor material used in region 12. The weight percent is based upon the total weight of region 20.

Exemplary enthalpies of formation are provided in the following table:

| Element | Compound | $\Delta H^\circ_{f,298}$ (kJ/mol) | $\Delta H^\circ_{f,298}$ (kJ/mol · Pn) | Ref. |
| --- | --- | --- | --- | --- |
| Zn | Zn$_3$P$_2$ | –240 | –120 | 1 |
| Cd | Cd$_3$P$_2$ | –100 | –50 | 2 |
| Mg | Mg$_3$P$_2$ | –416 | –208 | 2 |
| Ca | Ca$_3$P$_2$ | –543 | –271 | 1 |
| Sr | Sr$_3$P$_2$ | –607 | –335 | 2 |
| Ti | TiP | –275 | –275 | 2 |
| Zr | ZrP | –402 | –402 | 2 |

This table shows values for the standard enthalpy of formation, $\Delta_f H^\circ_{298}$, in kJ/mol for a series of metal phosphides. Values are also adjusted to kJ/mol·Pn, or the standard enthalpy of formation per mole of phosphorus atoms. See references (1) I. Barin, *Thermochemical Data of Pure Substances*, 3$^{rd}$ Ed. 1995; and (2) V. B. Chernogorenko, K. A. Lynchak, *Combustion, Explosion, and Shock Waves*, Vol. 34, No. 3, 1998.

Note from this Table that the Net Reactivity of a metal to form one kind of pnictide may be different among different kinds of Group IIB/VA semiconductors. Consequently, a co-reactive species may have a favorable, strongly negative Net Reactivity with lattice Group VA species of one kind of Group IIB/VA semiconductor but not with another.

For instance, the Net Reactivity of Mg to form magnesium phosphide would be different with respect to zinc phosphide than it is with respect to cadmium phosphide. By way of example, calcium phosphide has an $\Delta H^\circ_{f,M}$ value of –271 kJ/mol-Pn and zinc phosphide has an $\Delta H^\circ_{f,S}$ value of –120 kJ/mol-P$_N$. The Net Reactivity of Ca in this context is –151 kJ/mol-Pn, which is more negative than –100 kJ/mol-Pn. Consequently, it would be desirable in illustrative mode of practice to use at least Ca in region 20 in combination with at least zinc phosphide in region 12.

In comparison, magnesium phosphide has an $\Delta H^{\circ}_{f\,M}$ value of $-208$ kJ/mol-Pn and zinc phosphide has an $\Delta H^{\circ}_{f\,s}$ value of $-120$ kJ/mol-Pn. The Net Reactivity of Mg in this context is $-88$ kJ/mol-Pn, which is more positive than $-100$ kJ/mol-Pn. Consequently, it would be desirable to avoid using a region 20 that includes only Mg when the region 12 includes substantially only zinc phosphide.

Yet, the combination of Mg and/or other co-reactive species with other Group IIB/VA semiconductors or the combination of other co-reactive species and optionally Mg with zinc phosphide generally would be expected to exhibit suppressed diffusion of the co-reactive species into p-type Group IIB/VA semiconductors and potentially mitigate against unwanted reaction of the co-reactive species with a capping layer that may be present, while maintaining good reactivity of the co-reactive species with the Group VA species of a p-type Group IIB/VA semiconductor.

Thus, as an option, if region 20 were to include Mg and the semiconductor region 12 includes zinc phosphide, it is desirable that one or more of the following conditions is met:

(i) the Mg is present provided in combination with at least one other metal-containing species co-reactive with a the Group VA element, wherein the at least one other metal-containing co-reactive species that has a phosphide pnictide enthalpy of formation at standard temperature and pressure with respect to the Group VA element that is more negative than the phosphide pnictide enthalpy of formation at standard temperature and pressure of magnesium phosphide the magnesium pnictide; and/or (ii) if the Group IIB/VA semiconductor includes zinc phosphide, then the semiconductor region comprises at least one additional Group IIB/VA semiconductor is also provided; and/or (iii) at least one pnictide reaction product has a pnictide enthalpy of formation at standard temperature and pressure that is at least 100 kJ/mol-Pn more negative than the enthalpy of formation at standard temperature and pressure of at least one p-type Group IIB/VA semiconductor included in the semiconductor region; and/or (iv) at least a portion of step (b) occurs while the co-reactive species is capped with a barrier that helps isolate the co-reactive species from at least one of oxygen and water.

However, Ca is so reactive, as indicated by its Net Reactivity in this context, that Ca may have a tendency to react with other layers, if any, included in the precursor. For instance, Ca may have a tendency to react with transparent conducting oxide(s) that may be included in region 24 (described further below) overlying the Ca in region 20. Thus, a barrier layer (not shown) may be interposed between the Ca in region 20 and region 24 to help prevent the undesired reactions. One example of a suitable barrier would be Mg, which is much less reactive with transparent conducting oxide than is Ca and yet could also serve a beneficial role when used in combination with the Ca to enhance the electronic properties of precursor 10. In another embodiment, a barrier layer comprises ZnS. Barrier layers are discussed further below.

In some modes of practice, and without wishing to be bound, it is believed that the reaction of the present invention may yield a p/n heterojunction to the extent that the reaction produces an n-type mixed metal phosphide. For example, the reaction of Ca with zinc phosphide may yield n-type calcium zinc phosphide. In such instances, the co-reactive species provided in region 20 may include not only Ca but also an amount of Ti effective to help enhance n-type characteristics. In one mode of practice, using about 0.01 weight percent to about 5 weight percent, more preferably about 0.05 to about 1 weight percent of Ti based on the total weight of Ca and Ti would be suitable to enhance n-type characteristics.

If use of Mg is not desired to provide such a barrier function or other beneficial role, and even though Mg can be used singly or in combination with other co-reactive species in region 20, it is desirable in preferred embodiments to limit the amount of Mg in region 20 when region 12 includes substantially only zinc phosphide. A disadvantage of utilizing Mg as a co-reactive species in combination with an embodiment of region 12 incorporating only zinc phosphide as a Group IIB/VA semiconductor is that concentrations of Mg above $10^{12}$ cm$^{-3}$ can greatly increase the resistivity of the p-type Group IIB/VA semiconductor, thereby impairing the current collection properties of the device. Furthermore, it is expected that concentrations of Mg above $10^{16}$ cm$^{-3}$ would introduce an additional loss mechanism whereby Mg impurities catalyze the non-radiative recombination of photogenerated carriers. Proper utilization of a co-reactive species other than only Mg in photovoltaic devices incorporating only zinc phosphide as a Group IIB/VA semiconductor is expected to yield increases in fill factor and short circuit current density relative to similarly-treated devices using solely Mg as a co-reactive species.

Accordingly, if the semiconductor region is at least about 95 weight percent, preferably at least about 98 weight percent, more preferably at least about 99 weight percent zinc phosphide, it is preferred that at least 80 atomic percent, more preferably at least 90 atomic percent, and even more preferably at least 99 atomic percent of region 20 includes at least one of Ca, Sr, Ba, Sc, Y, Ti, Zr, V, Cr, Nb, Mo, Hf, a compound of these, an alloy of these, combinations thereof, or the like with the proviso that region 20 contains no more than 20 atomic percent, more preferably no more than about 10 atomic percent, and even more preferably no more than about 5 atomic percent, and even more preferably no more than about 1 atomic percent Mg.

As compared to using Mg when region 12 is substantially all zinc phosphide use of other co-reactive species such as Ca, Sr, Ba, Sc, Y, Ti, V, Cr, Nb, Mo, Hf in region 20 offer numerous advantages. First, it is believed that the use of these species would provide a resultant photovoltaic device with improved electronic performance. Without wishing to be bound, a potential theory to explain the improved performance can be suggested. When a precursor such as precursor 10 is heated to convert the precursor into a device with improved electronic performance, it is believed that at least a portion of the co-reactive species in region 20 migrates into region 12 (and/or vice versa). A species such as Mg diffuses very easily into region 12 formed substantially entirely from zinc phosphide, and even may penetrate throughout a substantial portion, if not the entirety of, the region 12. In the past, such extensive diffusion was suspected of forming a region of n-type doping in originally p-type $Zn_3P_2$ semiconductor material. However, more recent data demonstrates that Mg doping forms highly compensated material with resistivities on the order of $10^4$ ohm-cm. Extensive Mg diffusion would have resulted in degradation of both the fill factor and short circuit current densities of treated devices due to a drastic increase in both the series resistance and trap-assisted non-radiative recombination of the diffused region.

Additionally, when the objective is to form a homojunction between n-type and p-type material, such extensive diffusion would likely disrupt the interface between the original p-type material and the resultant n-type material that is formed in situ via intrinsic doping and Group VA depletion.

In contrast to the combination of Mg and zinc phosphide, co-reactive species such as Ca, Sr, Zr, and Ti are believed to diffuse much more slowly in zinc phosphide as well as other Group IIB/VA semiconductor materials under typical reaction conditions. The rate of diffusion could be low enough that a substantial portion of migrating species would tend to react with phosphorous and other co-reactive species before migration becomes too extensive into the p-type material. Consequently, the penetration of such other co-reactive species into the Group IIB/VA semiconductor region 12 would be more controlled and more limited. It would be expected that a better quality homojunction would be formed. Furthermore, the more negative enthalpy of formation of the consequent metal phosphide (e.g. $M_3P_2$ (M=Ca, Sr, Ba; MP (M=Y, Ti, Zr, V, Cr, Nb, Mo, Hf) has the advantage of favoring metal phosphide formation (i.e. a greater enthalpy of reaction). Use of such co-reactive species also would provide a beneficial passivating effect as described further below as a result of the heating treatment that converts precursor 10 into device 100.

Region 20 may have a thickness within a wide range. Greater thicknesses would be workable, but leftover material in region 20 remaining after conversion of precursor 10 to device 100 could be less optically transmittant than might be desired. Using more material than is needed to create a homojunction also could be wasteful without sufficient countervailing benefit(s). It is possible that left over material could be susceptible to oxidation, moisture degradation, or contribute to other issues that could impair the electronic performance and/or stability of the resultant device. If the region 20 were to be too thin, there might be insufficient co-reactive species to provide the desired n-type and/or passivating characteristics. Yet, in preferred modes of practice, using sufficiently thin layers helps to ensure that a majority, and more preferably substantially all, of region 20 is consumed in the course of a heat treatment to form device 100. This would help to ensure that high levels of optical transmittance are retained, that the passivation effect is achieved to a greater degree, and/or that high quality n-type material and corresponding p/n homojunction is formed.

Balancing such concerns, it is preferred that region 20 has a thickness in the range from about 1 nm to about 2000 nm, more preferably about 1 nm to about 100 nm, more preferably about 2 nm to about 50 nm, even more preferably from about 2 nm to about 20 nm.

Region 20 may be continuous or discontinuous, but desirably region 20 at least covers the intended active area of the resultant photovoltaic device 100 that is to be fabricated. As a consequence of forming region 20 on region 12, heating (as described further below) occurs while the p-type Group IIB/VA semiconductor is in contact with a solid phase comprising one or more of the co-reactive species. Co-reactive metal species such as Ca, Sr, Zr, and Ti may have a tendency to be reactive with oxygen or other oxidizing materials. In such instances, the reaction between the co-reactive species and oxygen competes with the desired reaction with the Group VA species. Indeed, the reaction with oxygen may be so favored that too little of the desired Group VA reaction occurs at all. Formation of the oxide can interfere with or even prevent the desired results.

Accordingly, the co-reactive species desirably is protected from oxygen or other oxidizing species. Such protection desirably is provided as the layer incorporating such species is formed and thereafter at least until the heating treatment has been completed. This protection can be provided in one or more ways. According to one strategy, the layer incorporating the one or more co-reactive species can be formed and maintained under a protected atmosphere or under vacuum in which oxygen is excluded as much as is practical and/or desired. Exemplary gases for this purpose include nitrogen, argon, carbon dioxide, combinations of these, and the like. According to another strategy, one or more capping layers can be formed over the co-reactive species for protection against oxygen that might thereafter be in the ambient.

Using at least one capping layer over the co-reactive species offers numerous advantages. As one advantage, the cap effectively protects the co-reactive species against not only oxygen, but other potentially damaging environmental elements, such as water, contaminants, oxygen, and the like. The capping layer allows the subsequent heating reaction to occur under ambient atmosphere, which makes this stage of the fabrication easier and economical. Further, the cap helps promote more complete reaction between the co-reactive species and the Group VA species. This enhances the electronic performance of the resultant photovoltaic device. In addition to the abovementioned advantages, the capping layer can be selected to be a beneficial layer in the device architecture (e.g. a transparent conductive layer).

A wide range of capping layers may be used. In some embodiments, a cap structure may be sacrificial. After the cap function is performed, such layers are removed before further layers (if any) are formed in order to complete the device being fabricated. Sacrificial capping layers can be formed from a wide range of materials, including photoresist or other masking materials. In other embodiments, a cap structure can be an element of the device being fabricated and is not removed in its entirety. Such functional capping layers include window layers, insulating layers, transparent conducting layers, antireflective layers, barrier layers, combinations of these and the like.

For purposes of illustration, FIG. 1 shows precursor 10 as including a transparent conducting region 24 that serves as a cap to protect the underlying region 20 from oxidation. Later, the region 24 serves as at least a portion of an electrical contact between the semiconductor material and external circuitry (not shown). The transparent conductive layer 24 may be formed from a variety of conductive materials. In some embodiments, layer 24 may incorporate a metal film that is sufficiently thin, e.g., a thickness in the range from about 5 nm to about 200 nm, preferably from about 30 nm to about 100 nm, in representative embodiments so that the resultant films are conductive but yet sufficiently transparent to allow incident light to reach the semiconductor region 12. As used herein, the term "metal" refers not only to metals, but also to metal admixtures such as alloys, intermetallic compositions, combinations of these, and the like. These metal compositions optionally may be doped. Examples of metals that could be used to form thin, optically transparent layers 30 include the metals suitable for use in the backside contact region 18, combinations of these, and the like.

As an alternative to metals or in combination with metals, a wide variety of transparent conducting oxides (TCO) or combinations of these may be incorporated into the transparent conductive layer 24. Examples include fluorine-doped tin oxide, tin oxide, indium oxide, indium tin oxide (ITO), aluminum doped zinc oxide (AZO), zinc oxide, combinations of these, and the like. In one illustrative embodiment, the transparent conductive layer 24 is indium tin oxide. TCO layers are conveniently formed via sputtering or other suitable deposition technique.

In some embodiments, the capping region 24 may provide additional or alternative functions, such as to prevent reaction of the co-reactive species with another functional layer in the device 100 (FIG. 2) or its precursor 10 (FIG. 1). For example, the capping region 24 may have a multilayer structure that includes a transparent conductive layer and an underlying barrier layer that prevents reaction of the co-reactive species of region 20 with the transparent conductive layer. In one illustrative embodiment, the transparent conductive layer includes indium tin oxide (ITO), region 20 includes a co-reactive species such as Ca or Mg, and region 12 includes zinc phosphide. In addition, a barrier layer of ZnS is provided between the ITO and region 20 in order to help prevent reaction of the co-reactive species of region 20 with the indium tin oxide (ITO). The ZnS layer is sufficiently thin, e.g., about 5 nm to about 50 nm, preferably from about 5 nm to about 20 nm in representative embodiments, so that the resultant barrier film is sufficiently transparent to allow incident light to reach the semiconductor region 12. Yet, the barrier film is desirably thick enough to prevent reaction of the co-reactive species with the transparent conductive region.

Devices comprised of this architecture have been shown to exhibit substantially high Voc (>600 mV) using a thin co-reactive species layer (20 nm). For comparison, in the absence of a barrier between the ITO and the underlying regions, the performance of devices using >99% Mg as the co-reactive metal requires 30-50 nm of Mg to show $V_{oc}$>400 mV after air annealing. Devices incorporating ZnS capping layers show significantly higher $V_{oc}$ values after air annealing for 90 min at 100° C., with the use of thinner Mg layers. Clearly, the barrier film improves device performance. Without wishing to be bound by theory, it is postulated that the improvements result because the barrier prevents reaction between the co-reactive metal and the ITO, thereby allowing the co-reactive metal to react with the $Zn_3P_2$ with less interference. The observation of $V_{oc}$>600 mV in devices utilizing ZnS capping layers is consistent with the expected suppression of reaction of the co-reactive species with ITO. It also is demonstrated that using a barrier allows thinner layers of the co-reactive metal to be used As shown by dotted lines, the light incident side of precursor 10 and the resultant device 100 (FIG. 2) in representative embodiments optionally may incorporate a collection grid 26. Optionally, an electrically conductive material such as a wire or ribbon (not shown) also may be used to electrically couple collection grid 26 to external electrical connections. Also as an option, a protective barrier system (not shown) desirably may be provided. The protective barrier system is positioned over the electronic grid 26 and helps to isolate and protect the resultant device 100 from the environment, including protection against water degradation. The barrier system optionally also may incorporate elastomeric features that help to reduce the risk of damage to device 10 due to delamination stresses, such as might be caused by thermal cycling and or localized stress such as might be caused by impact from hail and or localized point load from the weight of an installer or dropped tools during installation. If present, grid 26, the barrier protection system, and/or the ribbon may be incorporated into precursor 10 or incorporated into device 100 after the heat treatment described herein.

The precursor 10 of FIG. 1 may be formed in a variety of ways. According to one illustrative technique, a semiconductor sample corresponding to region 12 is prepared using a suitable technique. One technique involves combining phosphorous chips and zinc particles at a suitably elevated temperature. The powders are grown into polycrystalline boules. Typical grain sizes range from about 1 $mm^2$ to about 5 $mm^2$. A typical resistivity as-grown is in the range from about 100 ohm-cm to about 2000 ohm-cm.

A wafer is diced from a boule to provide region 12. Optionally, the wafer is doped with at least one of P, As, and/or Sb. Preferably, the doping occurs under conditions effective to saturate the wafer with the dopant. Doping tends to lower the resistivity and raise the open circuit voltage for enhance electronic performance. In one mode of practice, doping with phosphorous lowered resistivity to about 20 ohm-cm.

The physical characteristics of the doped wafer can be enhanced to improve the quality of the precursor. As one option, the wafer can be polished to provide well-defined, flat major faces. Such polishing can introduce stresses and mechanical damage. Accordingly, polishing can be followed by an etching treatment to alleviate the stress and remove the mechanical damage. A convenient way to accomplish this is to use an etchant containing Br to remove approximately 1 micron from the wafer surface. In contrast to acid etchants, Br etchants retain the smooth surfaces achieved by polishing.

Next, a metal film containing at least one co-reactive species can be deposited onto one major face of the wafer using conventional procedures. A typical thickness is in the range from about 2 to about 50 nm. A transparent conducting layer can then be formed over the metal film such as by sputtering. A typical thickness is about 50 nm to about 100 nm.

Advantageously, the metal film and transparent conducting layer can be formed on the wafer without requiring sputter etching of the wafer surface. In contrast, sputter etching has been required to achieve photovoltaic characteristics in many prior art processes. Without wishing to be bound, it is believed that sputter etching is not required when practicing the present invention because of the passivating effect that occurs as co-reactive species react to form at least a pnictide containing passivation layer during the heating treatment.

The one or more layers of substrate 14 may also be formed and/or laminated to the wafer. The substrate 14 may be formed in whole or in part before or after the layers are formed on the other side of the wafer.

The electronic properties of precursor 10 are enhanced by allowing regions 12 and 20 to react with each other. In some modes of practice, depending upon the Net Reactivity of constituents of region 20, this reaction may occur under ambient conditions or even while precursor 10 is chilled. In other instances, heating region 12 while region 12 is in contact with region 20 may facilitate carrying out the reaction at a desired rate. This may involve one or more heat treatments. Without wishing to be bound, it is believed that heating converts precursor 10 into the device 100 having the structure shown in FIG. 2. FIG. 2 schematically shows that heating converts a portion of p-type region 12 into n-type region 30. A homojunction is thus formed at the interface 31 between the n-type and p-type material.

Without wishing to be bound, it is believed that, in practical effect, the reaction between the co-reactive species and the Group VA species causes the relative Group VA content of the p-type region 12 to be reduced while the relative Group IIB content is increased. It is believed that the co-reactive species reacts with different kinds the Group VA content that might be present, including dopant(s), lattice material, etc. Consequently, the reacted Group VA material is no longer available to contribute to the original p-type characteristics. Consequently, it is believed that the reaction causes the corresponding portion of the p-type region 12 to become intrinsically doped with Group IIB species, thereby causing the portion of the p-type region 12 to exhibit n-type characteristics. The reaction thus would yield an n-type region that is relatively rich in Group IIB species via Group VA depletion. It is believed, therefore, that the reaction helps to form a homojunction between the remaining p-type material and the resultant n-type material.

A passivating region 32 also is believed to form. It is believed that this passivating region comprises phosphide and/or other reaction products that result from reactions between constituents of the original region 12 and region 20. For example, calcium would react with lattice and/or dopant phosphorous to form calcium phosphide. FIG. 2 illustrates a mode of practice in which all of the original region 20 has been consumed during the heat treatment to form region 32 and is no longer present in its original form. In other embodiments in which greater amounts of co-reactive species are incorporated into region 20 at the outset, a portion (not shown) of region 20 in its original form may still be present in the resultant device 100.

Formation of passivating region 32 tends to be favored when region 20 is protected by a cap such as region 24 during the heating treatment(s). If the region 20 is not protected from oxygen or other contaminants during heating such as by region 24, the formation of the passivating phosphide material to form region 32 is not observed. Also, the formation of the desired n-type region is of lesser quality, if such a region forms at all, as depletion of the Group VA element via reaction with the co-reactive species would be compromised.

Without passivation, the interface between p-type and/or n-type Group IIB/VA regions and/or between n-type region 30 and region 24 can be of poor quality due to defects, oxidation, impurities, or the like. Passivation significantly enhances the quality of these interfaces. In particular, it would be observed that the effect of air oxidation is removed and defects are subsumed.

Also significantly, conventional methodologies have required sputter etching or another comparable treatment of Group IIB/VA semiconductor surfaces in order to incorporate photovoltaic functionality into regions 12 and 30. In contrast, passivation resulting from the principals of the present invention allows photovoltaic functionality to be achieved without requiring such a sputter etching treatment.

The improvement of electronic properties upon heating may be further enhanced if the p-type starting Group IIB/VA material incorporates at least one Group VA species as dopant(s) or as species that are located interstitially in the $Zn_3P_2$ crystal lattice. Surprisingly, the presence of the Group VA dopant(s) provides a resultant device with enhanced electrical properties, even though the Group VA dopant is originally incorporated only into p-type regions to be converted later into n-type or other material. While not wishing to be bound by theory, it is believed that the Group VA dopant does not compromise resultant n-type characteristics due to the ability of the Group VA dopant to react with the co-reactive species in a way to help form an n-type phase. Yet, the reaction removes the reacted Group VA material from contributing to p-type characteristics or unduly interfering with n-type. It is counterintuitive that including a p-type, Group VA dopant into a p-type precursor would enhance the formation and quality of the resultant n-type material.

As another advantage, the presence of a Group VA dopant is compatible with the desired reaction between the co-reactive species and the Group VA content of the Group IIB/VA semiconductor. Use of other kinds of p-type dopants in the region(s) to be converted to n-type material that are not reactive with the co-reactive species could interfere or otherwise conflict with the formation of the n-type material.

As another advantage, using Group VA dopants may help limit the penetration depth of the co-reactive species into the Group IIB/VA material. This would enhance the resolution and quality of the p/n junction. In other words, the Group VA dopant helps to ensure that n-type material forms to a limited depth. Otherwise, some Group VA species could migrate more widely through Group IIB/VA semiconductor material, compromising p-type characteristics in regions intended to remain p-type.

Heating may occur under a wide range of conditions. If the heating temperature were to be too high, thermal degradation of one or more layers could result. Also, delamination could occur among layers such as if coefficients of thermal expansion differ too much. On the other hand, if the temperature is too low, the desired reaction may proceed too slowly to achieve desired throughput or may not occur at all. Balancing such concerns, heating at a temperature in the range from about 35° C. to about 300° C., preferably about 50° C. to about 150° C., more preferably about 90° C. to about 110° C. would be suitable for a time period in the range from about 10 seconds to about 48 hours, preferably about 2 minutes to about 4 hours, more preferably about 30 minutes to about 120 minutes. For example, in one mode of practice, heating at about 100° C. for about 100 minutes would be suitable.

The heating may occur under vacuum, at ambient pressure, and/or at an elevated pressure. When region 20 is protected by a cap such as layer 24, ambient pressure is effective and economical, and is presently preferred.

The present invention will now be further described with respect to the following illustrative examples.

EXAMPLE 1

The $Zn_3P_2$ samples used in this example are grown by a physical vapor transport process. Red phosphorus chips and zinc shot (99.9999%) are combined at 850° C. to form $Zn_3P_2$ powders. The powders are then processed using crystal growth techniques into polycrystalline boules 1 cm in diameter and 4 cm in length, with grain sizes of ~1-5 mm$^2$. The resulting crystals are diced with a diamond saw and have as-grown resistivity between 100-2000 Ωcm. Annealing with white phosphorus in sealed ampoules at 400° C. for 20 hours is effective at reducing the wafer resistivity to ~20 Ωcm due to doping by phosphorus interstitials. Both undoped and P-doped samples are polished with diamond paste to produce $Zn_3P_2$ wafers. Samples with 1 cm diameter and 500-600 μm thickness are etched for 30 s in 2-3% (v:v) $Br_2$ in $CH_3OH$, rinsed in $CH_3OH$, dried under a stream of $N_2$, and used promptly thereafter.

ITO/Ca/$Zn_3P_2$ solar cells are fabricated from P-doped $Zn_3P_2$ samples. Freshly etched wafers are patterned with an array of 1 mm$^2$ active area devices by optical photolithography. Ca films of thickness about 50 nm followed by ITO films of thickness ~100 nm are deposited by RF magnetron sputtering on the patterned $Zn_3P_2$ wafers without any sputter etching of the sample. Back contacts of Ag with ~100 nm thickness are also deposited by RF magnetron sputtering. The cells are subjected to mild air annealing at 100° C. for 10 min to yield the finished device.

EXAMPLE 2

As a way of testing the reactivity of Ca as well as another co-reactive metal other than Ca, a set of devices composed of an ITO capping layer (100 nm), a co-reactive metal (50 nm), an etched and polished $Zn_3P_2$ substrate, and a Ag back contact (200 nm) were fabricated. In one set of devices, Ca was used as the co-reactive metal. In another set of devices, Mg was used as the co-reactive metal. Typically the $V_{oc}$ of photolithographically-defined devices using >99% Mg as the co-reactive metal are low, <100 mV, as-fabricated. In similar devices, heat treatment at 100° C. results in an increase in $V_{oc}$ due to the reaction between the co-reactive metal and $Zn_3P_2$.

Devices incorporating Ca metal as the co-reactive species show significantly higher $V_{oc}$ as-fabricated. The observation of $V_{oc}$>380 mV in as-fabricated devices utilizing Ca is consistent with the expected higher reactivity of Ca metal with the phosphorus in $Zn_3P_2$ as compared to Mg when used as a co-reactive species (as distinguished from the use of Mg as a capping layer as described further below). The devices were characterized with an AM1.5G spectrum at 0.75 suns intensity.

Figure 3:
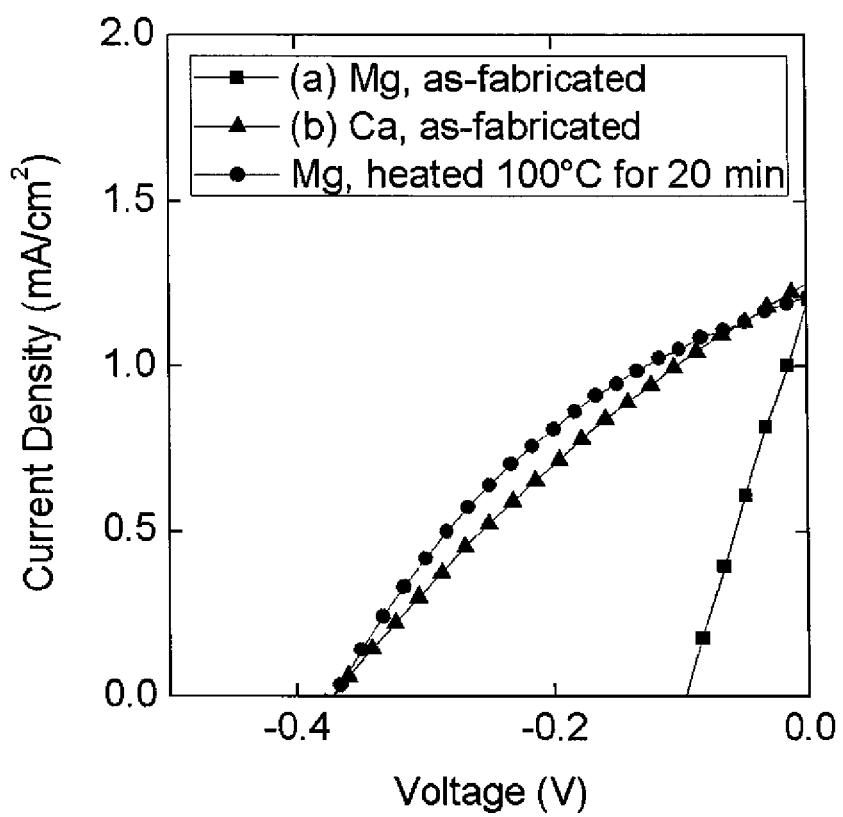
FIG. 3 is a graph showing current density as a function of voltage for photovoltaic devices prepared in Example 2.

FIG. 3 is a graph showing current density as a function of voltage for the samples of ITO/$Zn_3P_2$ photovoltaic devices incorporating either Mg or Ca as co-reactive metals. Device (a) includes 50 nm of Mg metal and shows a low as-fabricated $V_{oc}$<100 mV. Device (b) includes 50 nm of Ca metal and shows a significantly higher as-fabricated $V_{oc}$>380 mV. By comparison, device (a) required 20 min of heat treatment at 100° C. to reach the performance of device (b) as-fabricated.

EXAMPLE 3

Solar cells are made in accordance with Example 1 except that for each cell in this example, Sr or Ti, respectively, is substituted for Ca.

EXAMPLE 4

A solar cell is made in accordance with Example 1 except that a mixture or bilayer of Ca and Ti is used in place of Ca, wherein the mixture includes about 0.1 weight percent Ti based on the total weight of the Ca and Ti.

EXAMPLE 5

Solar cells are respectively made in accordance with Examples 1 and 3 except that cadmium phosphide is substituted for zinc phosphide.

EXAMPLE 6

A solar cell is made in accordance with Example 1 except that cadmium phosphide or cadmium zinc phosphide, respectively, is substituted for zinc phosphide and Mg is used in place of Ca.

EXAMPLE 7

Solar cells are made in accordance with Example 1 except that for each cell in this example, Sc, Y, V, Nb, Mo, or Hf, respectively is substituted for Ca.

EXAMPLE 8

Solar cells are respectively made in accordance with Example 6 except that cadmium phosphide is substituted for zinc phosphide.

EXAMPLE 9

Figure 4:
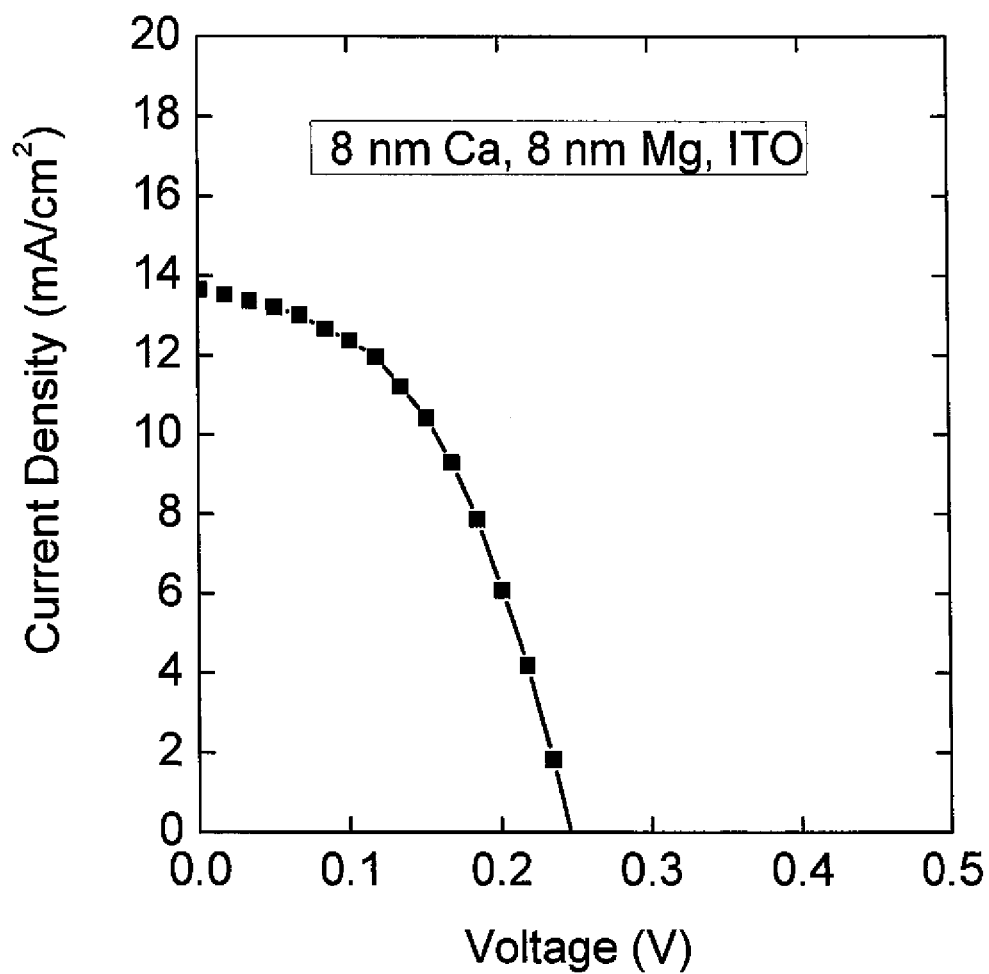
FIG. 4 is a graph showing current density as a function of voltage for a photovoltaic device prepared in Example 9.

ITO/Mg/Ca/$Zn_3P_2$ solar cells are fabricated from P-doped $Zn_3P_2$ samples prepared as described in Example 1. Freshly etched wafers are patterned with an array of 1 mm² active area devices by optical photolithography. A Ca film of thickness about 8 nm, followed by a Mg layer of 8 nm thickness were deposited by RF magnetron sputtering on the patterned $Zn_3P_2$ wafers without any sputter etching of the sample. A layer of indium tin oxide (ITO) of thickness ~100 nm is then deposited on top of the Mg layer. Back contacts of Ag with ~100 nm thickness are also deposited by RF magnetron sputtering. The cells were not annealed. The devices were characterized with an AM1.5G spectrum at 0.75 suns intensity. A typical curve showing current density as a function of voltage is shown in FIG. 4. In this case, the Ca film can be viewed as the co-reactive metal and the Mg film can be viewed as a capping layer over the Ca film.

EXAMPLE 10

ITO/ZnS/Mg/$Zn_3P_2$ solar cells are fabricated from P-doped $Zn_3P_2$ samples prepared in the same fashion as described in Example 1. Freshly etched wafers are patterned with an array of 1 mm² active area devices by optical photolithography. Mg films of thickness about 10 or 20 nm followed by ZnS films of thickness about 10 nm and ITO films of thickness about 100 nm are deposited by RF magnetron sputtering on the patterned $Zn_3P_2$ wafers without any sputter etching of the sample. Back contacts of Ag with ~100 nm thickness are also deposited by RF magnetron sputtering. The cells are subjected to air annealing at 100° C. for 90 min to yield the finished device. Devices incorporating ZnS diffusion barriers show $V_{oc}$ values>500 mV and >600 mV for Mg layers of 10 and 20 nm, respectively, after air annealing for 90 min at 100° C. (see FIG. 5). For comparison, devices prepared in the same manner without the presence of a ZnS diffusion barrier required 30-50 nm of Mg in order to achieve $V_{oc}$>400 mV. ITO. The devices were characterized with an AM1.5G spectrum at 0.75 suns intensity.

Figure 5:
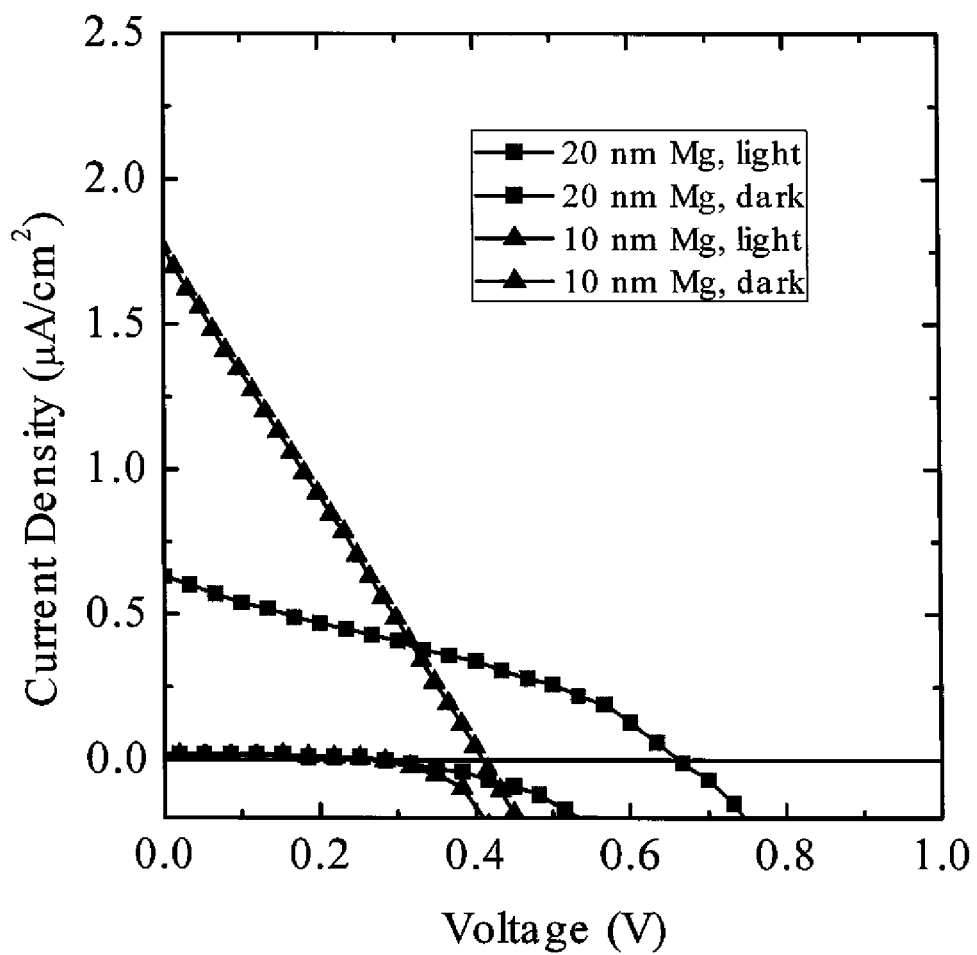
FIG. 5 is a graph showing current density as a function of voltage for photovoltaic devices prepared in Example 10.

FIG. 5 shows current density as a function of voltage for the ITO/ZnS/$Zn_3P_2$ photovoltaic devices incorporating Mg as a co-reactive metal. Device (a) includes 20 nm of Mg metal and 10 nm of ZnS diffusion barrier and shows a significantly higher as-fabricated $V_{oc}$>600 mV. Device (b) includes 10 nm of Mg metal and 10 nm of ZnS diffusion barrier and shows a lower $V_{oc}$<500 mV. Low photocurrents are attributed to the intrinsic, resistive ZnS layer and can be expected to be improved by using ZnS diffusion barriers with optimized doping.

EXAMPLE 11

ITO/ZnS/Ca/$Zn_3P_2$ solar cells are fabricated in the same manner as Example 10 except that a 20 nm layer of Ca is deposited instead of Mg.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A method of making a photovoltaic device or portion thereof, comprising the steps of:
   (a) providing at least one p-type Group IIB/VA semiconductor in a semiconductor region; and
   (b) causing the at least one p-type Group IIB/VA semiconductor region to react with a species that is co-reactive with a Group VA element incorporated into the semiconductor region and that is in contact with the semiconductor region with the proviso that, if the at least one metal-containing species includes Mg, then at least one of
      (i) the Mg is present in combination with at least one other metal-containing species co-reactive with a Group VA element that has a phosphide enthalpy of formation at standard temperature and pressure that is more negative than the phosphide enthalpy of formation at standard temperature and pressure of magnesium phosphide; and/or (ii) if the Group IIB/VA semiconductor includes zinc phosphide, then the seminconductor region comprises at least one additional Group IIB/VA semiconductor; and/or (iii) at least one pnictide reaction product has a pnictide enthalpy of formation at standard temperature and pressure that is at least 100 kJ/mol-Pn more negative than the enthalpy of formation at standard temperature and pressure of at least one p-type Group IIB/VA semiconductor included in the semiconductor region.

2. The method of claim 1, wherein the semiconductor region comprises at least one of zinc phosphide, cadmium phosphide, zinc cadmium phosphide, or mixtures thereof.

3. The method of claim 1, wherein the semiconductor region comprises at least one arsenide or antimonide of at least one of zinc and cadmium.

4. The method of claim 1, wherein the co-reactive species comprises Ca.

5. The method of claim 4, wherein step (b) comprises providing a first region in contact with the semiconductor region, wherein the first region comprises Ca, and providing a second region in contact with the first region, wherein the second region comprises Mg.

6. The method of claim 5, wherein step (b) further comprises providing a transparent conducting layer in contact with the second region.

7. The method of claim 1, wherein the co-reactive species comprises at least one of Mg, Sr, Ba, Sc, Y, Ti, V, Cr, Nb, Mo, and Hf.

8. The method of claim 1, wherein step (b) comprises heat treating the semiconductor region.

9. The method of claim 1, wherein at least a portion of step (b) occurs while the co-reactive species is capped with a barrier that helps isolate the co-reactive species from at least one of oxygen and water.

10. The method of claim 9, wherein the barrier comprises an insulator.

11. The method of claim 9, wherein the barrier comprises a transparent conductor.

12. The method of claim 1, wherein the pnictide reaction product has a pnictide enthalpy of formation at standard temperature and pressure that is at least 150 kJ/mol-Pn more negative than the enthalpy of formation at standard temperature and pressure of at least one p-type Group IIB/VA semiconductor included in the semiconductor region.

13. The method of claim 1, wherein the reaction of step (b) occurs under conditions effective to provide a p/n homojunction or under conditions effective to form a p/n heterojunction.

14. A method of making a p/n photovoltaic junction comprising a Group IIB/VA semiconductor comprising the steps of:

(a) providing at least one p-type Group IIB/VA semiconductor in a semiconductor region; and (b) providing at least one metal-containing species in contact with the Group IIB/VA semiconductor, wherein the metal-containing species has a Net Reactivity that is −100 kJ/mol-Pn or more negative with respect to the Group IIB/VA semiconductor; and (c) converting a portion of the at least one p-type Group IIB/VA semiconductor to an n-type semiconductor.

15. The method of claim 14, wherein step (c) is carried out under conditions effective to provide a p/n homojunction or under conditions effective to provide a p/n heterojunction.

16. The method of claim 14, wherein the Net Reactivity is about −150 kJ/mol-Pn or more negative with respect to the Group IIB/VA semiconductor.

17. The method of claim 14, wherein the metal containing species comprises Ca.

18. The method of claim 14, wherein the metal containing species comprises Ca and Ti.

19. The method of claim 14, wherein step (b) further comprises providing at least one additional metal containing species.

20. A device, comprising:

(a) at least one p-type Group IIB/VA semiconductor region; and (b) at least one n-type semiconductor region in contact with the p-type Group IIB/VA semiconductor region, wherein (i) the n-type semiconductor region comprises or is in contact with at least one metal pnictide for which a metal constituent of the metal pnictide has a Net Reactivity with respect to the p-type Group IIB/VA semiconductor region that is about −100 kJ/mol-Pn or more negative with respect to the p-type Group IIB/VA semiconductor; or (ii) a p/n junction is formed at an interface between the p-type and n-type regions; and the device further comprises additional region in contact with at least one of the p-type and n-type regions that includes at least one reaction product between a Group VA element of the p-type Group IIB/VA semiconductor region and at least one metal species other than Mg that is co-reactive with the Group VA element of the p-type Group IIB/VA semiconductor region.

21. The device of claim 20, wherein the metal pnictide is a mixed metal pnictide semiconductor.

22. The device of claim 20, wherein the metal pnictide is selected from calcium phosphide and magnesium phosphide, with the proviso that, if the metal pnictide is magnesium phosphide, then at least one of (i) the magnesium phosphide is present in combination with at least one other metal pnictide for which a metal constituent of the metal pnictide has a phosphide enthalpy of formation at standard temperature and pressure that is more negative than the phosphide enthalpy of formation at standard temperature and pressure of magnesium phosphide; and/or (ii) if the Group IIB/VA semiconductor includes zinc phosphide, then at least one additional Group IIB/VA semiconductor is also provided; and/or (iii) at least one metal pnictide has a metal constituent having a Net Reactivity that is at least 100 kJ/mol more negative than the enthalpy of formation at standard temperature and pressure of at least one p-type Group IIB/VA semiconductor included in the p-type Group IIB/VA semiconductor region.

23. A method of making a photovoltaic device or portion thereof, comprising the steps of:

(a) providing in a semiconductor region comprising at least one p-type Group IIB/VA semiconductor including a Group IIB element and a Group VA element; and (b) causing the at least one p-type Group IIB/VA semiconductor to react with at least one species that is co-reactive with the Group VA element to form a pnictide reaction product with the proviso that, if the at least one co-reactive species includes Mg such that the pnictide reaction product includes a magnesium pnictide, then at least one of (i) the Mg is provided in combination with at least one other metal-containing species co-reactive with the Group VA element, wherein the at least one other metal-containing co-reactive species has a pnictide enthalpy of formation at standard temperature and pressure with respect to the Group VA element that is more negative than the pnictide enthalpy of formation at standard temperature and pressure of the magnesium pnictide; and/or (ii) if the Group IIB/VA semiconductor includes zinc phosphide, then the seminconductor region comprises at least one additional Group IIB/VA semiconductor; and/or (iii) at least one pnictide reaction product has a pnictide enthalpy of formation at standard temperature and pressure that is at least 100 kJ/mol-Pn more negative than the enthalpy of formation at standard temperature and pressure of at least one p-type Group IIB/VA semiconductor included in the semiconductor region; and/or at least a portion of step (b) occurs while the co-reactive species is capped with a barrier that helps isolate the co-reactive species from at least one of oxygen and water.

* * * * *